(12) United States Patent
Shimomura

(10) Patent No.: US 6,693,330 B2
(45) Date of Patent: Feb. 17, 2004

(54) SEMICONDUCTOR DEVICE AND METHOD OF MANUFACTURING THE SAME

(75) Inventor: Narakazu Shimomura, Gojyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/919,801

(22) Filed: Aug. 2, 2001

(65) Prior Publication Data

US 2002/0036323 A1 Mar. 28, 2002

(30) Foreign Application Priority Data

Aug. 11, 2000 (JP) .................................... 2000-244881

(51) Int. Cl.⁷ .............................................. H01L 23/62
(52) U.S. Cl. ...................................... 257/357; 257/336
(58) Field of Search ................................. 257/357, 336

(56) References Cited

U.S. PATENT DOCUMENTS 6,229,182 B1 * 5/2001 Van Lieverloo ............ 257/355

FOREIGN PATENT DOCUMENTS

| JP | 6-349852 | 12/1994 |
| JP | 7-11267 | 4/1995 |

* cited by examiner

*Primary Examiner*—Jerome Jackson
(74) *Attorney, Agent, or Firm*—Nixon & Vanderhye P.C.

(57) ABSTRACT

A semiconductor device comprising an electrostatic protective element of the semiconductor device including a first conductivity type substrate and a second conductivity type high concentration diffusion layer formed on a surface of the substrate, and a semiconductor element including a source/drain and a gate electrode, wherein a first conductivity type diffusion layer having a higher concentration than the first conductivity type substrate is provided in an entire region under the second conductivity type high concentration diffusion layer.

13 Claims, 8 Drawing Sheets

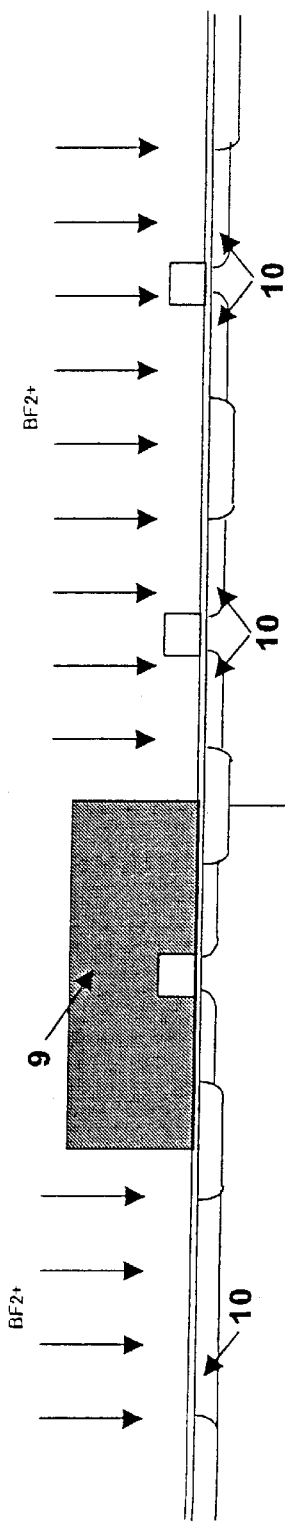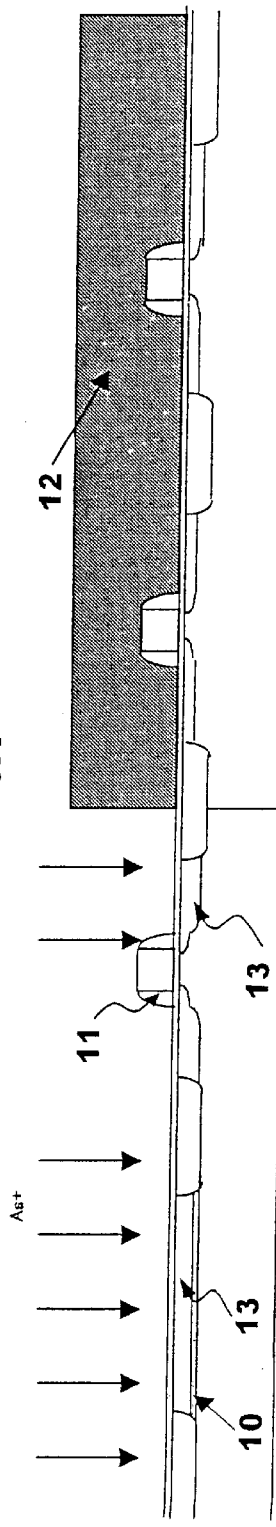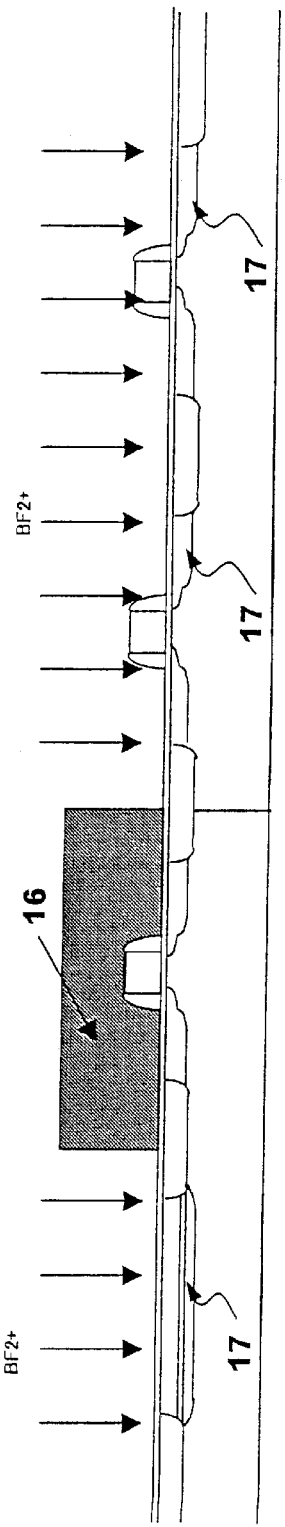

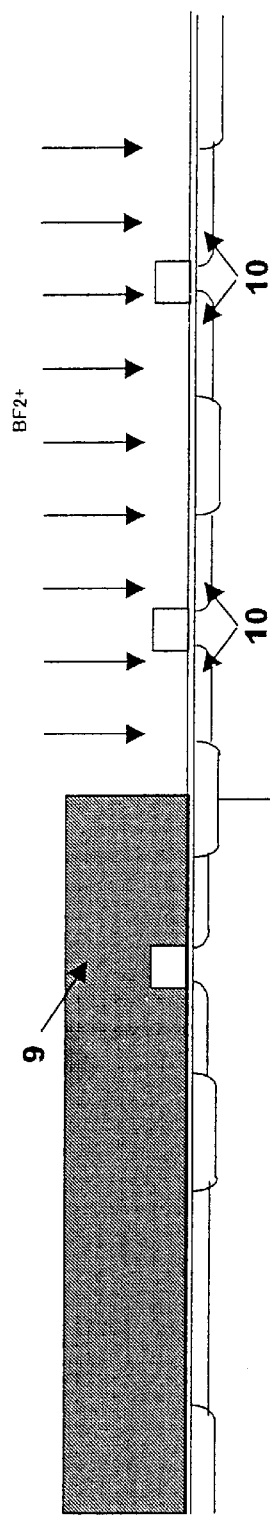
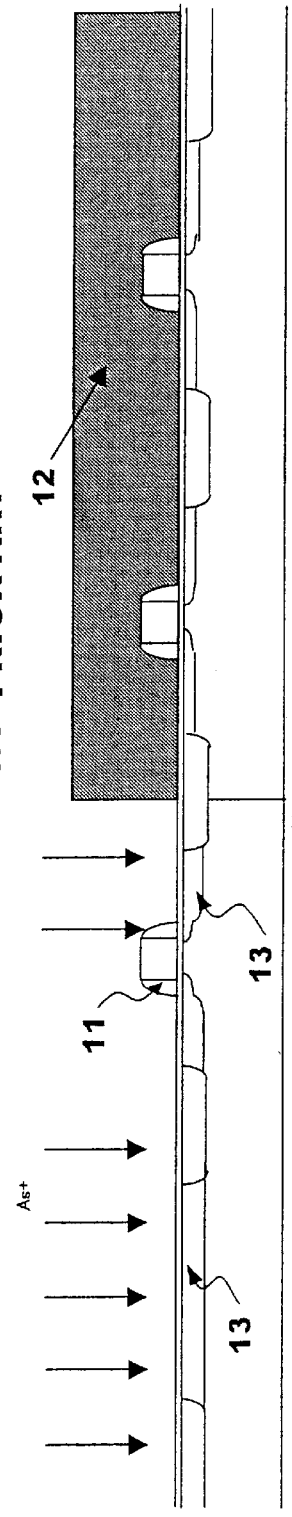
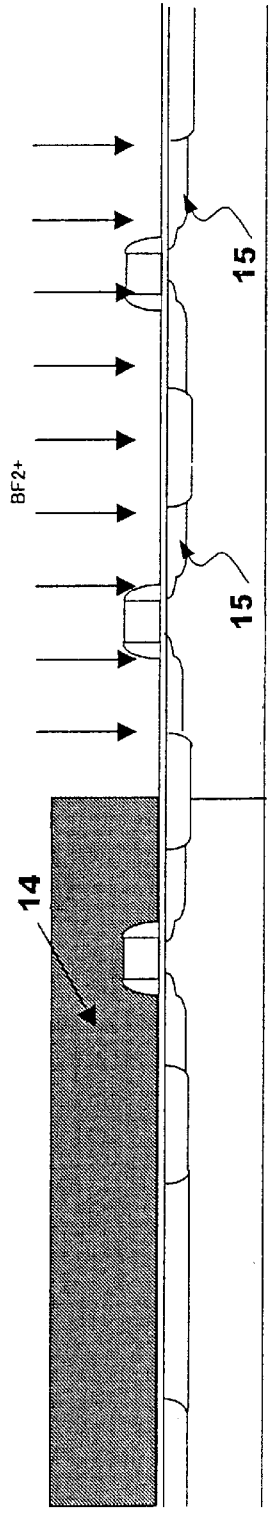
FIG. 8A PRIOR ART
FIG. 8B PRIOR ART
FIG. 8C PRIOR ART

SEMICONDUCTOR DEVICE AND METHOD OF MANUFACTURING THE SAME

CROSS-REFERENCE TO RELATED APPLICATION

This application is related to Japanese application No. 2000-244881 filed on Aug. 11, 2000, whose priority is claimed under 35 USC §119, the disclosure of which is incorporated by reference in its entirety.

BACKGROUND OF THE INVENTION

1. Field of the Invention

The present invention relates to a semiconductor device including an electrostatic protective element (input/output protective element, and also, hereinafter simply referred to as a protective element) for preventing electrostatic damage of a semiconductor element, and a method of manufacturing the same.

2. Description of the Related Art

As a method for preventing the electrostatic damage of a semiconductor element, there is a method in which protective elements as shown in FIG. 1 are provided, using diodes at respective input/output terminals. The protective elements are equivalent to the diodes provided in parallel to gate electrodes of transistors (semiconductor elements) connected to the input/output terminals. In FIG. 1, the breakdown voltage of the diode is set lower than a gate breakdown voltage, so that a breakdown current applied from the input/output terminal is made to flow to the diode and is made not to be applied to the gate electrode, and the semiconductor element is protected.

Hereinafter, a conventional manufacturing process of a semiconductor device including a general protective element will be described with reference to FIGS. 7A to 7C and FIGS. 8A to 8C.

(1) A P well 2 in which a P-type impurity such as boron is introduced and an N well 3 in which an N-type impurity such as phosphorus is introduced are formed in a semiconductor substrate 1. Thereafter, element separation is made by $SiO_2$ films 4 having a thickness of about 0.4 $\mu$m (FIG. 7A).

Three element regions are shown in the drawing, which are "a region A in which a protective element (diode) is formed", "a region B in which an Nch transistor is formed", and "a region C in which a Pch transistor is formed" from the left.

(2) A gate oxide film 5 having a thickness of about 0.005 to 0.02 $\mu$m is formed on the semiconductor substrate 1. Thereafter, a conductive film which becomes gate electrodes is deposited to a thickness of about 0.2 $\mu$m, and a photolithography and etching step is carried out to form gate electrodes 6 (FIG. 7B). As the conductive film which becomes the gate electrodes, there is a polysilicon film in which an impurity is introduced at a high concentration, a polycide film or the like.

(3) Next, a photolithography step is carried out so that the region C where the Pch transistor is formed is covered with a resist 7.

Thereafter, an N-type impurity such as phosphorus is implanted by an ion implantation method at an implantation energy of 30 to 50 keV and at an implantation amount of 3 to 5 E 13 atoms/$cm^2$ so that $N^-$type impurity layers 8 are formed (FIG. 7C).

(4) Next, a photolithography step is carried out so that the region B where the Nch transistor is formed and the region A where the protective element is formed are covered with a resist 9. Thereafter, a P-type impurity such as boron or boron difluoride is implanted by the ion implantation method at an implantation energy of 30 to 50 keV and an implantation amount of 3 to 5 E 13 atoms/$cm^2$ so that $P^-$type impurity layers 10 are formed (FIG. 8A).

(5) Next, after a $SiO_2$ film having a thickness of about 0.2 to 0.3 $\mu$m is deposited, etch-back is carried out by an RIE method to form a side wall 11. Thereafter, a photolithography step is carried out so that the region C where the Pch transistor is formed is covered with a resist 12. Next, an N-type impurity such as arsenic or phosphorus is implanted by the ion implantation method at an implantation energy of 30 to 50 keV and an implantation amount of 2 to 3 E 15 atoms/$cm^2$ so that $N^+$-type impurity layers 13 are formed (FIG. 8B).

(6) Next, a photolithography step is carried out so that the region B where the Nch transistor is formed and the region A where the protective element is formed are covered with a resist 14. Thereafter, a P-type impurity such as boron or boron difluoride is implanted by the ion implantation method at an implantation energy of 30 to 50 keV and an implantation amount of 2 to 3 E 15 atoms/$cm^2$ so that $P^+$-type impurity layers 15 are formed (FIG. 8C).

(7) Thereafter, an anneal treatment is carried out at 800° C. for 30 to 60 minutes so that the implanted impurities are activated, and the protective element and the respective transistors are formed.

As a semiconductor device is microminiaturized, a gate oxide film also becomes thin. That is, since a gate breakdown voltage also becomes low, it becomes necessary that the breakdown voltage of a diode used as a protective element is also set low.

Like this, as a method for strengthening electrostatic damage resistance by setting the breakdown voltage of a diode low, there is a method disclosed in Japanese Unexamined Patent Publication No. HEI 6(1994)-349852 or No. HEI 7(1995)-111267.

Japanese Unexamined Patent Publication No. HEI 6(1994)-349852 discloses a method in which an impurity is introduced into a well of a portion used as a protective element at a high concentration before formation of a gate electrode to decrease the breakdown voltage.

Japanese Unexamined Patent Publication No. HEI 7(1995)-111267 discloses a method in which the breakdown voltage is reduced by newly adding an $N^{++}$ region, and the degree of a drop is adjusted by the distance between the $N^{++}$ region and an $N^+$ region.

However, in such usual manufacturing methods, in order to reduce the breakdown voltage of a diode, it is necessary to newly add at least three steps of "a photolithography step of specifying a portion where an impurity is introduced at a high concentration", "an introduction step of introducing the impurity at the high concentration", and "a step of removing a resist". Besides, it becomes necessary to provide one photomask for specifying the region where the impurity is introduced at the high concentration. Thus, there are problems that the manufacturing costs are raised and the manufacturing period is prolonged.

Besides, in Japanese Unexamined Patent Publication No. HEI 7(1995)-111267, since the breakdown voltage is determined by the distance between the $N^{++}$ region and the $N^+$ region, it is necessary to control this distance with high precision. Thus, there is a problem that the precision of superposition of an exposure apparatus is required to be higher than normal precision.

SUMMARY OF THE INVENTION

In view of the above, the present invention has a purpose to provide a semiconductor device including a protective element having a low breakdown voltage without adding a new step and a photomask, and a method of manufacturing the same.

According to the present invention, provide is a semiconductor device comprising an electrostatic protective element of the semiconductor device including a first conductivity type substrate and a second conductivity type high concentration diffusion layer formed on a surface of the substrate, and a semiconductor element including a source/drain and a gate electrode, wherein a first conductivity type diffusion layer having a higher concentration than the first conductivity type substrate is provided in an entire region under the second conductivity type high concentration diffusion layer.

Further, according to the present invention, provided is a method of manufacturing the above-mentioned semiconductor device comprising: introducing an impurity into a region for forming the electrostatic protective element after the gate electrode is formed on the first conductivity type substrate to form the second conductivity type high concentration diffusion layer and the first conductivity type diffusion layer.

According to the present invention, after the gate electrode is formed on the substrate, impurities introduced to mainly form the source/drain are also implanted at the same time into the protective element region for preventing electrostatic damage, so that the impurity concentration of the protective element region can be made high.

Besides, according to the present invention, since the impurity concentration of the region of the electrostatic damage protective element is made high, the breakdown voltage can be reduced without adding a new step, and as a result, electrostatic damage resistance can be improved.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 6A to 6C are schematic views for illustrating steps of manufacturing a semiconductor device according to the present invention;

FIGS. 8A to 8C are schematic view for illustrating steps of manufacturing the semiconductor device according to the prior art.

DESCRIPTION OF THE PREFERRED EMBODIMENTS

Embodiment 1

Figure 1:
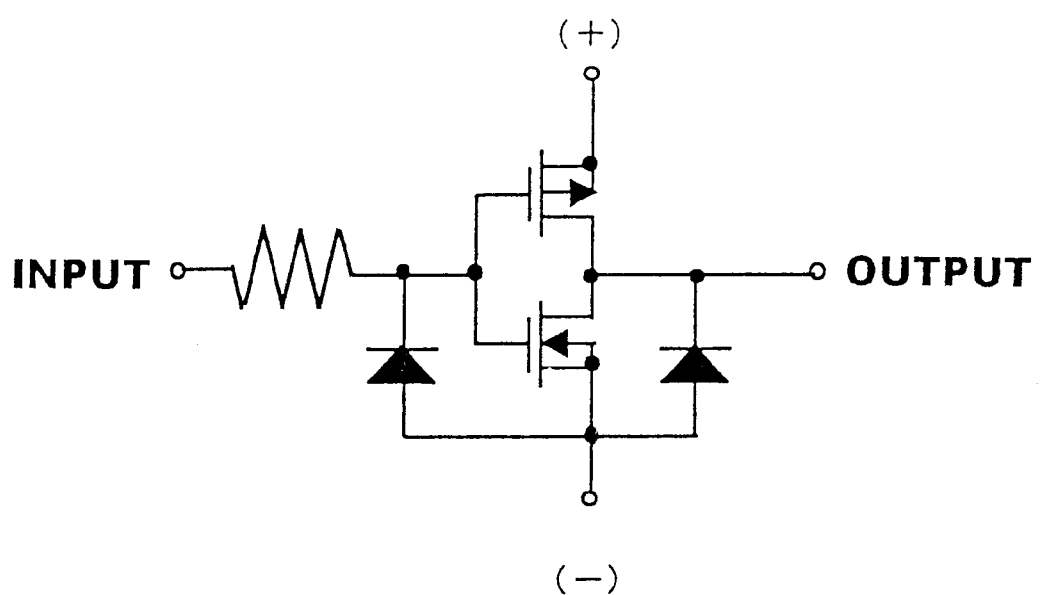
FIG. 1 is a view for illustrating a protective circuit for preventing electrostatic damage utilizing a diode.

An embodiment of the present invention will be described with reference to schematic process sectional views of FIGS. 2A to 2C and FIGS. 3A to 3C. The drawings show an example in which a N$^+$/P well diode is used as a protective element. Incidentally, for example, the circuit example of FIG. 1 can be adopted as a protection circuit diagram.

Figure 2A:
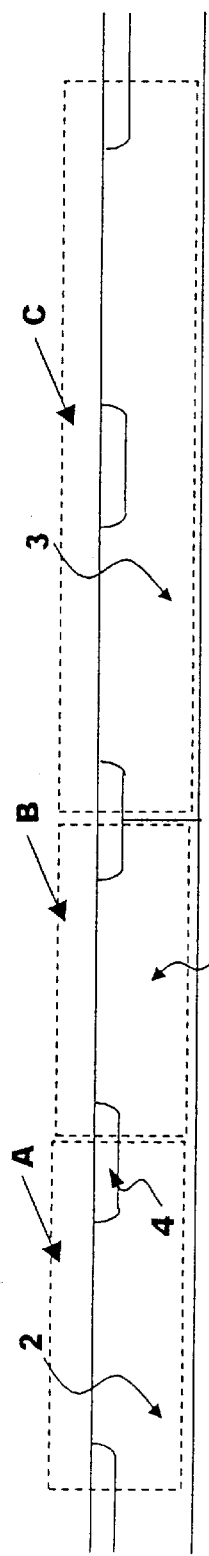
FIGS. 2A to 2C are schematic views for illustrating steps of manufacturing a semiconductor device according to the present invention.

(1) A P well 2 in which a P-type impurity such as boron is introduced and an N well 3 in which an N-type impurity such as phosphorus is introduced are formed in a semiconductor substrate 1 such as a silicon substrate. Thereafter, element separation is made by $SiO_2$ films 4 having a thickness of about 0.4 μm (FIG. 2A). In this drawing, a first conductivity type substrate means the semiconductor substrate 1 in which the P well 2 is formed.

Three element regions are shown in the drawing, which are "a region A in which a protective element (diode) is formed", "a region B in which an Nch transistor is formed", and "a region C in which a Pch transistor is formed" from the left.

Figure 2B:
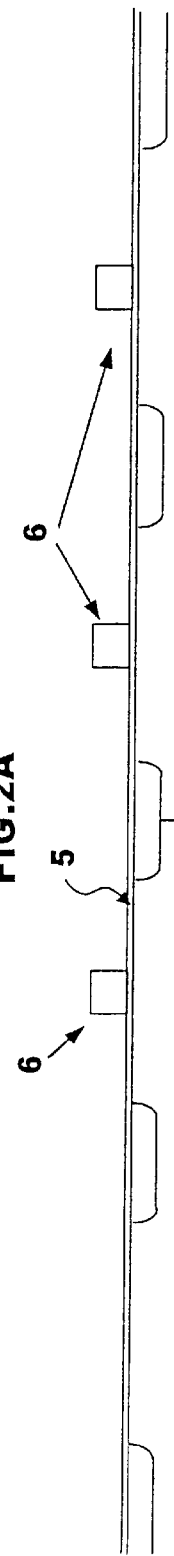

(2) A gate oxide film 5 having a thickness of about 0.005 to 0.02 μm is formed on the semiconductor substrate 1. Thereafter, a conductive film which becomes gate electrodes is deposited to a thickness of about 0.2 μm, and a photolithography and etching step is carried out to form gate electrodes 6 (FIG. 2B). As the conductive film which becomes the gate electrodes, there is a metal film, a polysilicon film in which an impurity is introduced at a high concentration, a polycide film or the like.

Figure 2C:
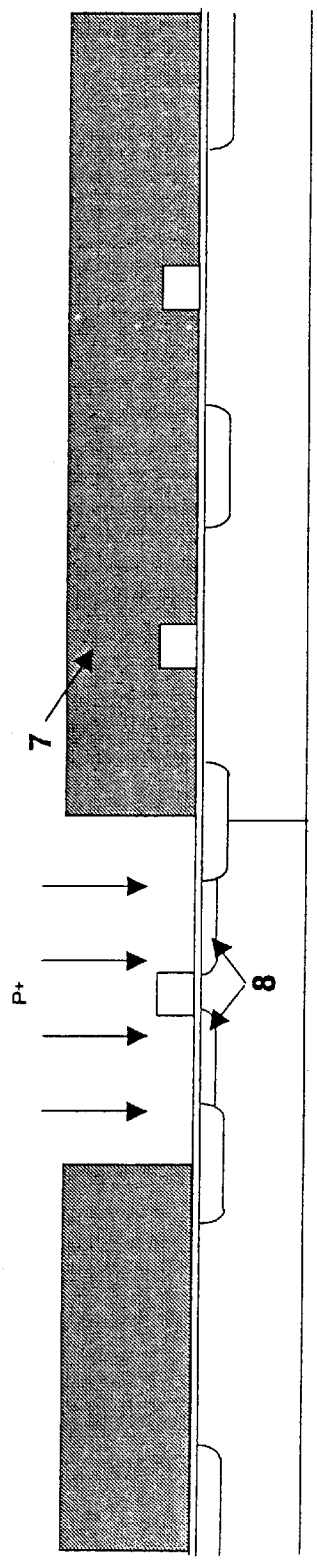

(3) Next, a photolithography step is carried out so that the region C where the Pch transistor is formed and the region A where the protective element is formed are covered with a resist 7. Thereafter, an N-type impurity such as phosphorus is implanted by an ion implantation method at an implantation energy of 30 to 50 keV and at an implantation amount of 3 to 5 E 13 atoms/cm$^2$ so that N-type impurity layers 8 are formed (FIG. 2C).

Figure 3A:
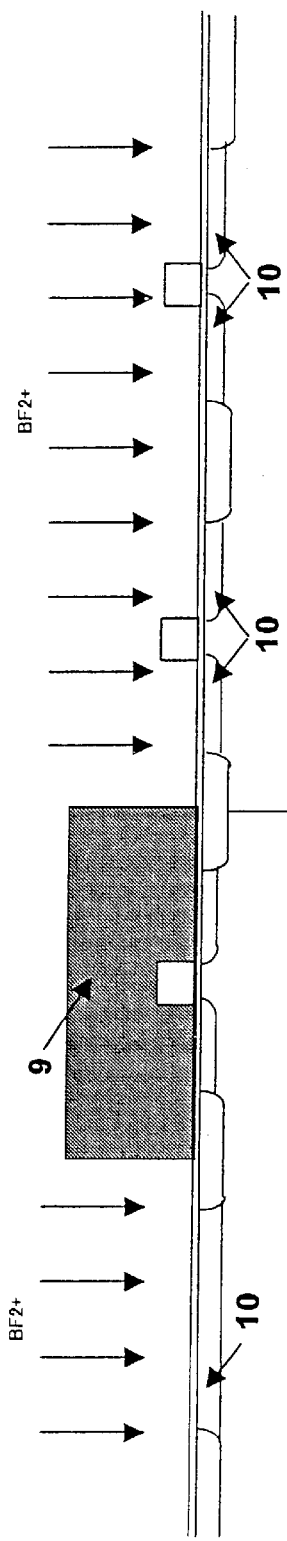
FIGS. 3A to 3C are schematic views for illustrating steps of manufacturing the semiconductor device according to the present invention.

(4) Next, a photolithography step is carried out so that the region B where the Nch transistor is formed is covered with a resist 9. Thereafter, a P-type impurity such as boron or boron difluoride is implanted by the ion implantation method at an implantation energy of 30 to 50 keV and an implantation amount of 3 to 5 E 13 atoms/cm$^2$ so that P-type impurity layers 10 are formed (FIG. 3A).

Figure 3B:
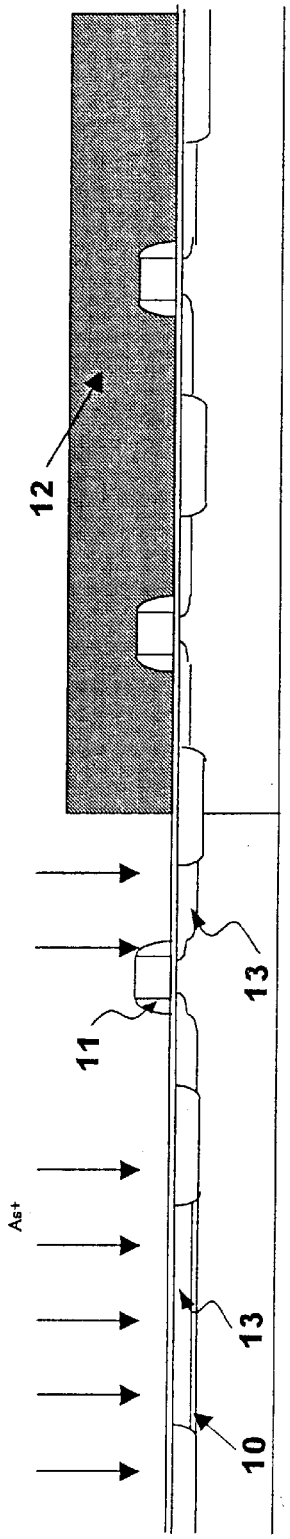

(5) Next, after a $SiO_2$ film having a thickness of about 0.2 to 0.3 μm is deposited, etch-back is carried out by an RIE method to form a side wall 11. Thereafter, a photolithography step is carried out so that the region C where the Pch transistor is formed is covered with a resist 12. Thereafter, an N-type impurity such as arsenic or phosphorus is implanted by the ion implantation method at an implantation energy of 30 to 50 keV and an implantation amount of 2 to 3 E 15 atoms/cm$^2$ so that N$^+$-type impurity layers 13 are formed (FIG. 3B).

By the above steps, the P-type impurity layer 10 (first conductivity type diffusion layer) is formed in the entire region under the N$^+$-type impurity layer 13 (second conductivity type high concentration diffusion layer). The impurity concentration of the P-type impurity region 10 is 1 to 5 E 17 atoms/cm$^3$, which is higher than the impurity concentration of 5 to 6 E 16 atoms/cm$^3$ of the P well.

Figure 3C:
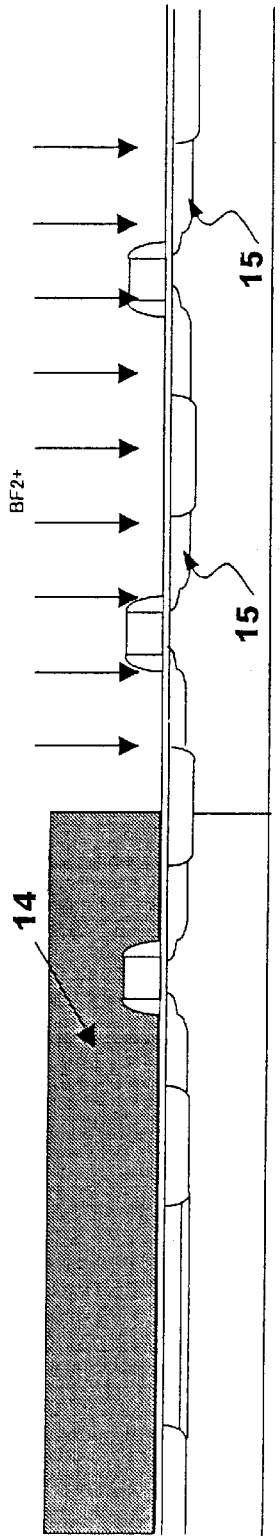

(6) Next, a photolithography step is carried out so that the region B where the Nch transistor is formed and the region A where the protective element is formed are covered with a resist 14. Thereafter, a P-type impurity such as boron or born difluoride is implanted by the ion implantation method at an implantation energy of 30 to 50 keV and an implantation amount of 2 to 3 E 15 atoms/cm$^2$ so that P$^+$-type impurity layers 15 are formed (FIG. 3C).

(7) Thereafter, an anneal treatment is carried out at 800° C. for 30 to 60 minutes so that the implanted impurities are activated, and the protective element and the respective transistors are formed.

Incidentally, Table 1 indicates the relation between the kind of an impurity and the depth just after implantation with respect to implantation energy.

TABLE 1

| kind of impurity | conductivity type | implantation energy | | |
|---|---|---|---|---|
| | | 30 keV | 40 keV | 50 keV |
| Phosphorus | N type | 0.037 μm | 0.049 μm | 0.061 μm |
| Arsenic | N type | 0.022 μm | 0.027 μm | 0.032 μm |
| Boron | P type | 0.099 μm | 0.130 μm | 0.161 μm |
| Boron difluoride | P type | 0.022 μm | 0.030 μm | 0.037 μm |

The diffusion coefficient of boron or boron difluoride in the anneal treatment after the implantation is also higher that of arsenic and phosphorus. Accordingly, as in this embodiment, when arsenic is implanted after boron or born difluoride is implanted, boron or boron difluoride is implanted more deeply than arsenic. That is, immediately after the implantation, boron or boron difluoride are implanted more deeply than arsenic, and after the anneal step, boron or boron difluoride are diffused more than arsenic. Thus, the well concentration of the region where the protective element is formed can be set higher.

Figure 4:
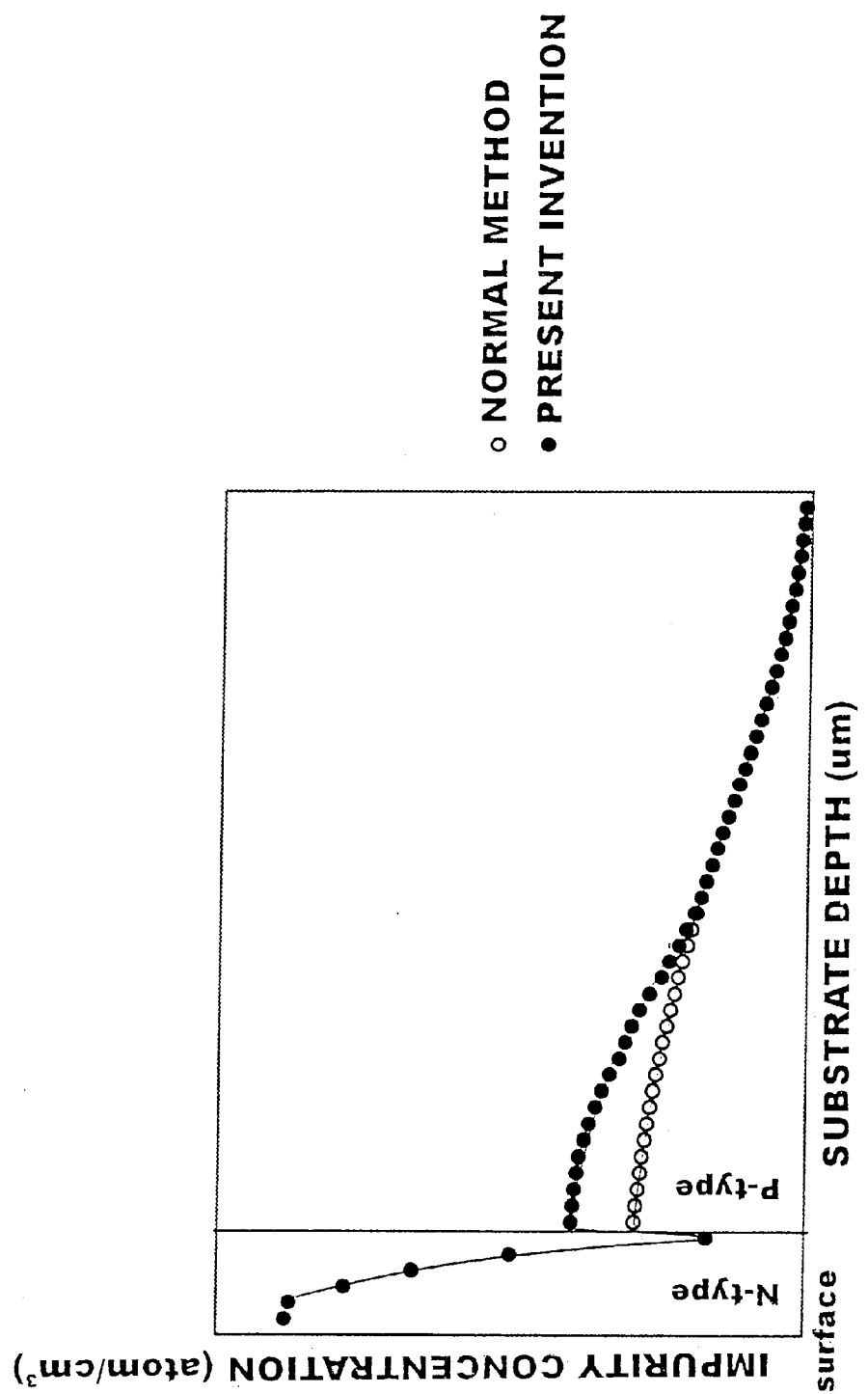
FIG. 4 is a graph for illustrating a relationship between a substrate depth and an impurity concentration.

Here, FIG. 4 shows the relation between impurity concentration and substrate depth in the case where a diode is manufactured by the normal method as shown in FIGS. 7A to 7C and FIGS. 8A to 8C and in the case where a diode is manufactured by the above method. As is understood from FIG. 4, in the method of the present invention, since the concentration of the P-type impurity is high as compared with the case where the diode is manufactured by the normal method, the breakdown voltage can be made low. More specifically, in the case of the above normal method, the breakdown voltage becomes about 13 to 15 V. On the other hand, in the case where the diode is manufactured by this embodiment, it is expected that the breakdown voltage becomes 6 to 8 V, and the breakdown voltage can be made lower than that of the related art.

Incidentally, although the case where the first conductivity type is the P type has been exemplified, the present invention can also be applied to the case of the N type. In that case, according to the kind of an impurity to be used, it is desirable to adjust implantation energy by, for example, a method in which the implantation energy of an N-type impurity is made higher than that of a P-type impurity.

Embodiment 2

Another embodiment of the present invention as a method of further reducing a breakdown voltage will be described with reference to schematic process sectional views of FIGS. 5A to 5C and FIGS. 6A to 6C. The drawings show an example in which an N$^+$/P well diode is used as a protective element.

Figure 5A:
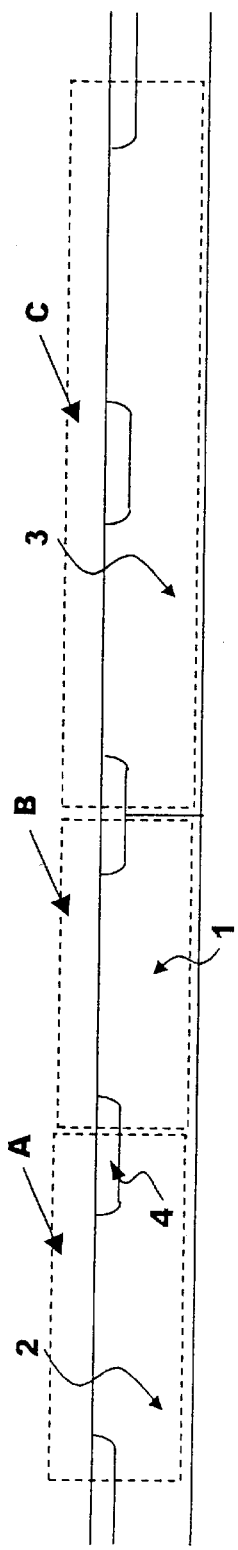
FIGS. 5A to 5C are schematic views for illustrating steps of manufacturing the semiconductor device according to the present invention.

(1) A P well 2 in which a P-type impurity such as boron is introduced and an N well 3 in which an N-type impurity such as phosphorus is introduced are formed in a semiconductor substrate 1 of silicon or the like. Thereafter, element separation is made by SiO$_2$ films 4 having a thickness of about 0.4 μm (FIG. 5A).

Three element regions are shown in the drawing, which are "a region A in which a protective element (diode) is formed", "a region B in which an Nch transistor is formed", and "a region C in which a Pch transistor is formed" from the left.

Figure 5B:
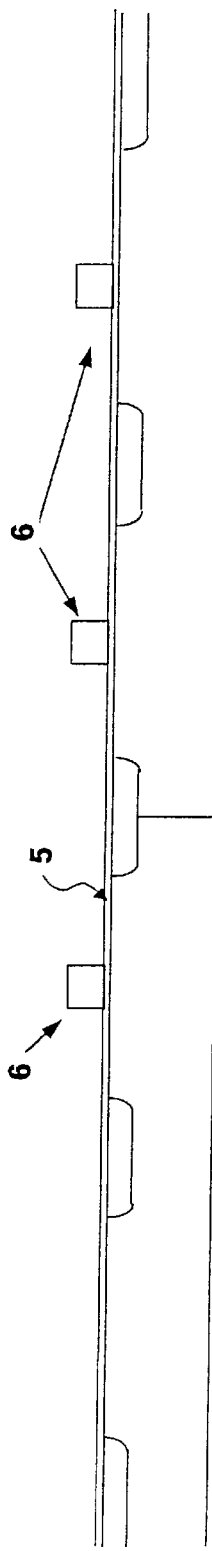

(2) A gate oxide film 5 having a thickness of about 0.005 to 0.02 μm is formed on the semiconductor substrate 1. Thereafter, a conductive film which becomes gate electrodes is deposited to a thickness of about 0.2 μm, and a photolithography and etching step is carried out to form gate electrodes 6 (FIG. 5B). As the conductive film which becomes the gate electrodes, there is a metal film, a polysilicon film in which an impurity is introduced at a high concentration, a polycide film or the like.

Figure 5C:
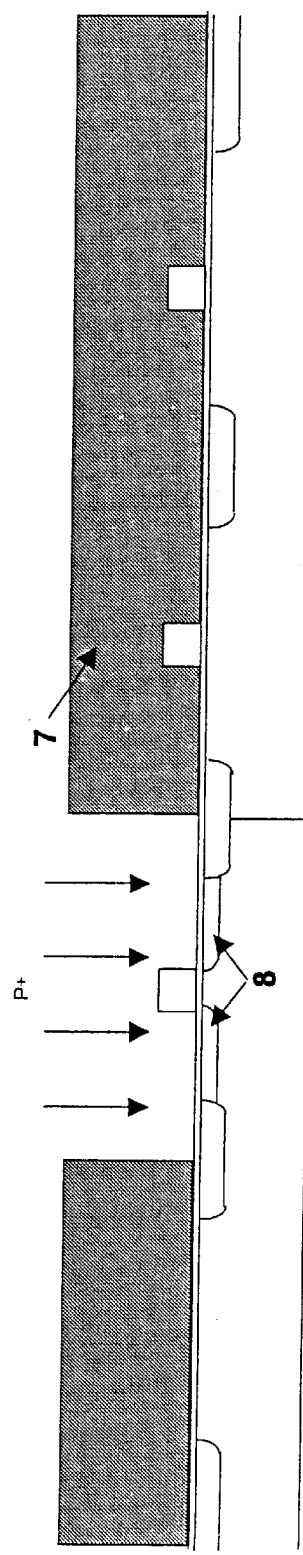
Figure 7A:
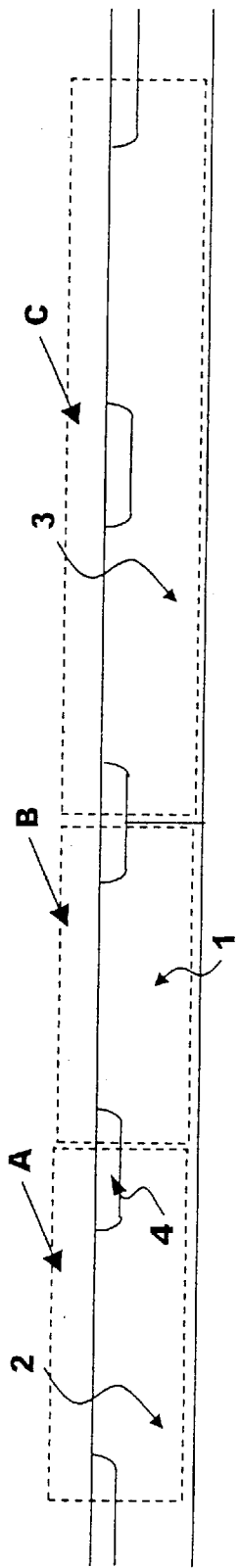
FIGS. 7A to 7C are schematic view for illustrating steps of manufacturing a semiconductor device according to the prior art.
Figure 7B:
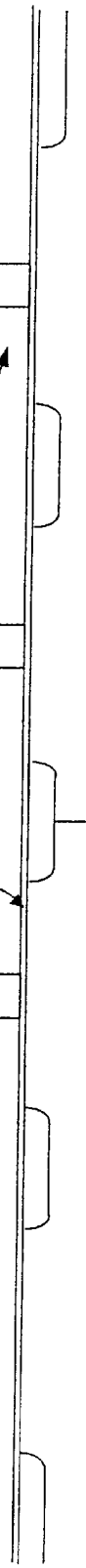
Figure 7C:
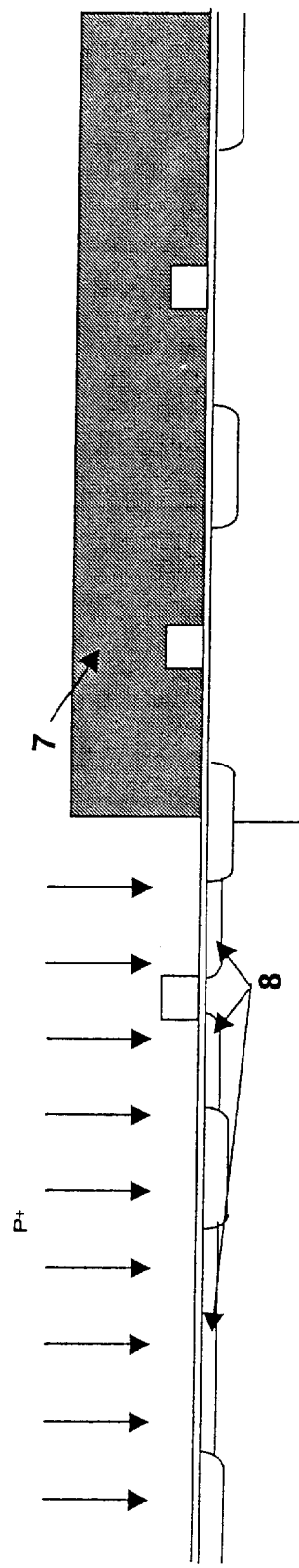

(3) Next, a photolithography step is carried out so that the region C where the Pch transistor is formed and the region A where the protective element is formed are covered with a resist 7. Thereafter, an N-type impurity such as phosphorus is implanted by the ion implantation method at an implantation energy of 30 to 50 keV and at an implantation amount of 3 to 5 E 13 atoms/cm$^2$ so that N-type impurity layers 8 are formed (FIG. 5C).

(4) Next, a photolithography step is carried out so that the region B where the Nch transistor is formed is covered with a resist 9. Thereafter, a P-type impurity such as boron or boron difluoride is implanted by the ion implantation method at an implantation energy of 30 to 50 keV and an implantation amount of 3 to 5 E 13 atoms/cm$^2$ so that P-type impurity layers 10 are formed (FIG. 6A).

(5) Next, after a SiO$_2$ film having a thickness of about 0.2 to 0.3 am is deposited, etch-back is carried out by an RIE method to form a side wall 11. Thereafter, a photolithography step is carried out so that the region C where the Pch transistor is formed is covered with a resist 12. Thereafter, an N-type impurity such as arsenic or phosphorus is implanted by the ion implantation method at an implantation energy of 30 to 50 keV and an implantation amount of 2 to 3 E 15 atoms/cm$^2$ so that N$^+$-type impurity layers 13 are formed (FIG. 6B).

(6) Next, a photolithography step is carried out so that the region B where the Nch transistor is formed is covered with a resist 16.

Thereafter, a P-type impurity such as boron or boron difluoride is implanted by the ion implantation method at an implantation energy of 30 to 50 keV and an implantation amount of 2 to 3 E 15 atoms/cm$^2$ so that P$^+$-type impurity layers 17 are formed (FIG. 6C). The breakdown voltage can be further reduced by forming the P$^+$-type impurity layer 17.

By the above steps, the P-type impurity layer 10 and the P$^+$-type impurity layer 17 (first conductivity type diffusion layer) are formed in the entire region under the N$^+$-type impurity layer 13 (second conductivity type high concentration diffusion layer). The impurity concentration of the P-type impurity region 10 is 1 to 5 E 17 atoms/cm$^3$, and the impurity concentration of the P$^+$-type impurity layer 17 is 1 to 5 E 18 atoms/cm$^3$, which is higher than the impurity concentration of 5 to 6 E 16 atoms/cm$^3$ of the P well.

(7) Thereafter, an anneal treatment is carried out at 800° C. for 30 to 60 minutes so that the implanted impurities are activated, and the protective element and the respective transistors are formed.

According to the above embodiment, the breakdown voltage of the diode can be set further lower than the embodiment 1. Besides, the implantation of the impurity into the protective element formation region in the step (4) may not be necessarily carried out. Accordingly, the invention can also be applied to a manufacturing process of a semiconductor device of a type having no LDD structure.

By using the present invention, the protective element having the low breakdown voltage can be formed without adding a new step in a manufacturing process of, for example, a CMOS semiconductor device, and the semiconductor device having high electrostatic damage resistance can be manufactured.

What is claimed is:

1. A semiconductor device comprising an electrostatic protective element for protecting a semiconductor element from electrostatic damage, the semiconductor device comprising:

the protective element comprising a protective diode including only a first conductivity type substrate, a second conductivity type high concentration diffusion layer formed on a surface of the substrate, and a first conductivity type diffusion layer having a higher concentration than the first conductivity type substrate, so that an anode and cathode of the diode are vertically stacked on one another with a pn junction of the diode provided therebetween;

the semiconductor element including a source/drain and a gate electrode, and wherein the first conductivity type diffusion layer having the higher concentration than the first conductivity type substrate is provided under the entire second conductivity type high concentration diffusion layer of the protective element.

2. A semiconductor device according to claim 1, wherein the first conductivity type substrate has an impurity concentration of 5 to 6 E16 atoms/cm$^3$ and the first conductivity type diffusion layer has an impurity concentration of 1 to 5 E17 atoms/cm$^3$.

3. A semiconductor device according to claim 1, wherein the first conductivity type substrate includes a first conductivity type well, and the electrostatic protective element, the semiconductor element and the first conductivity type diffusion layer are provided in the well.

4. A semiconductor device according to claim 1, wherein the semiconductor element includes an LDD region.

5. The semiconductor device of claim 1, wherein the semiconductor element to be protected is a transistor, and wherein the first conductivity type diffusion layer having the higher concentration than the first conductivity type substrate is laterally spaced from the transistor to be protected by the protective element, so that the first conductivity type diffusion layer is not located under any portion of the transistor to be protected.

6. The semiconductor device of claim 1, wherein the semiconductor element to be protected is a transistor, and wherein the first conductivity type diffusion layer having the higher concentration is not located under any portion of the source/drain of the transistor to be protected.

7. The semiconductor device of claim 1, wherein the protective diode is for protecting the semiconductor element from electrostatic damage.

8. A semiconductor device comprising:

an electrostatic protective element for protecting a transistor from electrostatic damage;

the electrostatic protective element including a protective diode including only a first conductivity type substrate, a second conductivity type high concentration diffusion layer formed on a surface of the substrate, and a first conductivity type diffusion layer having a higher concentration than the first conductivity type substrate so that an anode and cathode of the protective diode are vertically stacked;

the transistor to be protected including a source/drain and a gate electrode, and wherein the first conductivity type diffusion layer having the higher concentration than the first conductivity type substrate is provided immediately under the entire second conductivity type high concentration diffusion layer of the protective element, and wherein the first conductivity type diffusion layer is not located under any portion of the source/drain of the transistor to be protected.

9. The semiconductor device of claim 8, wherein the protective diode is for protecting the transistor from electrostatic damage.

10. The semiconductor device of claim 8, wherein the second conductivity type high concentration diffusion layer of the protective element is not part of the transistor to be protected.

11. The semiconductor device of claim 1, wherein the second conductivity type high concentration diffusion layer of the protective element is not part of the semiconductor element to be protected.

12. The semiconductor device of claim 1, wherein the semiconductor element is separated from the electrostatic protective element by a file comprising an oxide of silicon.

13. The semiconductor device of claim 8, wherein the transistor to be protected is separated from the electrostatic protective element by a film comprising an oxide of silicon.

* * * * *